(12) United States Patent
Honda

(10) Patent No.: US 12,738,897 B2
(45) Date of Patent: Sep. 15, 2026

(54) BIAS CIRCUIT AND POWER AMPLIFIER CIRCUIT

(71) Applicant: Murata Manufacturing Co., Ltd., Kyoto (JP)

(72) Inventor: Yuri Honda, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 457 days.

(21) Appl. No.: 18/448,457

(22) Filed: Aug. 11, 2023

(65) Prior Publication Data

US 2024/0056034 A1 Feb. 15, 2024

(30) Foreign Application Priority Data

Aug. 12, 2022 (JP) ................................. 2022-128993

(51) Int. Cl.

*H03F 3/195* (2006.01)
*H03F 1/02* (2006.01)
*H03F 1/30* (2006.01)
*H03F 3/21* (2006.01)
*H03F 3/24* (2006.01)

(52) U.S. Cl.

CPC ........... *H03F 1/302* (2013.01); *H03F 1/0222* (2013.01); *H03F 3/211* (2013.01); *H03F 3/245* (2013.01); *H03F 2200/318* (2013.01); *H03F 2200/451* (2013.01); *H03F 2200/555* (2013.01)

(58) Field of Classification Search

CPC ........ H03F 1/302; H03F 1/0222; H03F 3/245; H03F 2200/318; H03F 2200/451; H03F 2200/555; H03F 2200/15; H03F 2200/18; H03F 2200/222; H03F 1/0216; H03F 3/195; H03F 3/211; H03F 1/0261; H03F 1/565; H03F 3/183; H03F 3/21

USPC .......................................................... 330/296

See application file for complete search history.

(56) References Cited

U.S. PATENT DOCUMENTS 6,278,328 B1 * 8/2001 Yamamoto ............... H03H 1/52 330/207 P
2020/0136559 A1 4/2020 Shimamoto

FOREIGN PATENT DOCUMENTS

JP 2020-072468 A 5/2020

* cited by examiner

*Primary Examiner* — Jessica Han
*Assistant Examiner* — Khiem D Nguyen
(74) *Attorney, Agent, or Firm* — McDonald Hopkins LLC

(57) ABSTRACT

A bias circuit includes: a first transistor having an emitter or a source which supplies a bias to an amplifier operating by a power source voltage through a first resistive element and a base or a gate; a first capacitor having a first end electrically connected to the base or the gate of the first transistor and a second end connected to a ground; and a second transistor having a collector or a drain electrically connected to the base or the gate of the first transistor, a base or a gate electrically connected to the base or the gate of the first transistor, and an emitter or a source connected to a node which is supplied with a signal with experience of being amplified by the amplifier and the power source voltage.

15 Claims, 5 Drawing Sheets

101
BIAS SUPPLY CIRCUIT
161
161a
173
172
171
156
N1
N2
N3
N4
Ib
Ic1
Ie1
Vb1
Ve1
152
153
154
201
251
252
253
253a
351
50
50a
50b
50c
50d
50e
52
52a
52b
52c
52d
52e
52f
M/N
20
21
26
27
31
32
RFin
RF1
RFout
175
176
VCC1

102
BIAS SUPPLY CIRCUIT
161
161a
173
172
171
156
152
153
154
352
202
253
253a
252
251
254
N1
N2
N4
N5
Ib
Ic1
Ie1
Vb1
Ve1
M/N
20
21
31
32
RFin
RFout
RF1
50
50a
50b
50c
50d
50e
52
52a
52b
52c
52d
52e
52f
26
27
175
176
VCC1

BIAS CIRCUIT AND POWER AMPLIFIER CIRCUIT

CROSS REFERENCE TO RELATED APPLICATION

This application claims priority from Japanese Patent Application No. 2022-128993 filed on Aug. 12, 2022. The content of this application is incorporated herein by reference in its entirety.

BACKGROUND ART

The present disclosure relates to a bias circuit and a power amplifier circuit.

There is a power amplifier module including a driver stage amplifier and a power stage amplifier (see, for example, Japanese Unexamined Patent Application Publication No. 2020-72468).

BRIEF SUMMARY

In the power amplifier module described in Japanese Unexamined Patent Application Publication No. 2020-72468, power source voltages are supplied to respective transistors included in the driver stage amplifier and the power stage amplifier. For example, when the power source voltages are low, and power of a radio frequency (RF) signal is high, a base potential of the transistor included in the power stage amplifier may become instantaneously higher than a collector potential. In this case, a parasitic diode between a base and a collector of the transistor is turned on, and a signal of a frequency almost half of a frequency of the RF signal may be superimposed on an output signal from the power stage amplifier.

The present disclosure provides a bias circuit and a power amplifier circuit capable of inhibiting a parasitic diode between a base and a collector of a transistor from being turned on.

A bias circuit according to one aspect of the present disclosure includes: a first transistor having an emitter or a source which supplies a bias to an amplifier operating by a power source voltage through a first resistive element and a base or a gate; a first capacitor having a first end electrically connected to the base or the gate of the first transistor and a second end connected to a ground; and a second transistor having a collector or a drain electrically connected to the base or the gate of the first transistor, a base or a gate electrically connected to the base or the gate of the first transistor, and an emitter or a source connected to a node which is supplied with a signal with experience of being amplified by the amplifier and the power source voltage.

A bias circuit according to another aspect of the present disclosure includes: a first transistor having an emitter or a source which supplies a bias to an amplifier operating by a power source voltage through a first resistive element and a base or a gate which is supplied with a bias current; and a bypass circuit which is provided between the base or the gate of the first transistor and a node supplied with a signal with experience of being amplified by the amplifier and the power source voltage and feeds a part of the bias current to the node when a voltage of the node is less than a predetermined threshold.

According to the present disclosure, it is possible to provide a bias circuit and a power amplifier circuit capable of inhibiting a parasitic diode between a base and a collector of a transistor from being turned on.

DETAILED DESCRIPTION

Figure 1:
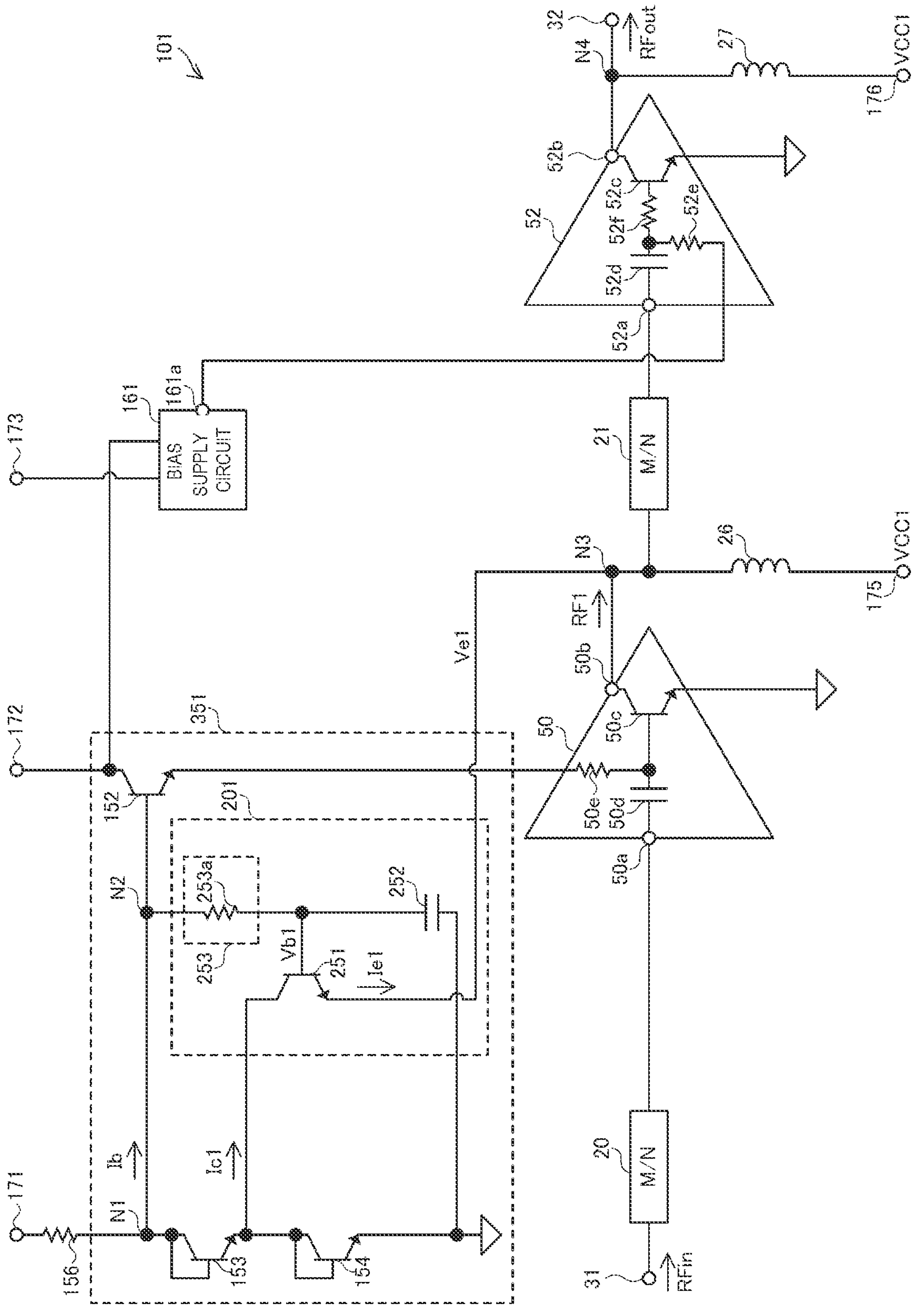
FIG. 1 is a circuit diagram of a power amplifier circuit 101.

Embodiments of the present disclosure will be described below in detail with reference to the drawings. Note that the same elements are denoted by the same reference characters and that a redundant description thereof will be omitted as much as possible.

First Embodiment

A power amplifier circuit 101 according to a first embodiment will be described. FIG. 1 is a circuit diagram of the power amplifier circuit 101. As shown in FIG. 1, the power amplifier circuit 101 is a two stage amplifier circuit which amplifies an input signal RFin supplied to an input terminal 31 and outputs an output signal RFout from an output terminal 32. The input signal RFin is, for example, an RF signal.

The power amplifier circuit 101 includes an input matching circuit 20, an interstage matching circuit 21, inductors 26 and 27, a driver stage amplifier 50, a power stage amplifier 52, a driver stage bias supply circuit 351 (bias circuit), a resistive element 156, and a power stage bias supply circuit 161.

The driver stage amplifier 50 includes an input terminal 50*a*, an output terminal 50*b* (driver stage output terminal), an amplifying transistor 50*c* (amplifier), a capacitor 50*d*, and a resistive element 50*e* (first resistive element). The power stage amplifier 52 includes an input terminal 52*a*, an output terminal 52*b* (power stage output terminal), an amplifying transistor 52*c*, a capacitor 52*d*, and resistive elements 52*e* and 52*f*.

The driver stage bias supply circuit 351 includes a biasing transistor 152 (first transistor), transistors 153 (first diode) and 154 (second diode), and a bypass circuit 201. The bypass circuit 201 includes a transistor 251 (second transistor), a capacitor 252 (first capacitor), and a voltage shift circuit 253 (first voltage shift circuit). The voltage shift circuit 253 includes a resistive element 253*a*.

Note that although the diode-connected transistors 153 and 154, each having a base, an emitter, and a collector, are used as the first diode and the second diode in the driver stage bias supply circuit 351, the driver stage bias supply circuit 351 is not limited to the transistors 153 and 154. A diode having two terminals, an anode and a cathode, may be used instead of the transistor 153. Alternatively, the diode may be used instead of the transistor 154.

In the present embodiment, the transistors, such as the amplifying transistors 50*c* and 52*c*, the biasing transistor 152, and the transistors 153, 154, and 251, are composed of, for example, bipolar transistors, such as a heterojunction bipolar transistor (HBT). Note that the transistors may be composed of other transistors, such as a metal-oxide-semiconductor field-effect transistor (MOSFET). In this case, a base, a collector, and an emitter may be read as a gate, a drain, and a source, respectively.

The driver stage amplifier 50 is an amplifier which operates by a power source voltage VCC1. The driver stage amplifier 50 amplifies the input signal RFin that is supplied from the input terminal 31 to the input terminal 50*a* through the input matching circuit 20 and outputs an amplified signal RF1 from the output terminal 50*b*.

Particularly, a power source voltage supply terminal 175 (driver stage power source voltage supply terminal) supplies the power source voltage VCC1 for causing the amplifying transistor 50*c* in the driver stage amplifier 50 to operate and is connected to a node N3 through the inductor 26. The output terminal 50*b* is connected to the node N3. For example, if envelope tracking is controlled in the power amplifier circuit 101, the power source voltage VCC1 changes.

The amplifying transistor 50*c* has a collector connected to the output terminal 50*b*, a base connected to the input terminal 50*a* through the capacitor 50*d*, and an emitter connected to the ground.

The interstage matching circuit 21 has a first end connected to the node N3 and a second end connected to the input terminal 52*a* in the power stage amplifier 52. The interstage matching circuit 21 matches an impedance of the driver stage amplifier 50 to an impedance of the power stage amplifier 52.

The power stage amplifier 52 is an amplifier which operates by, for example, the power source voltage VCC1. The power stage amplifier 52 amplifiers the amplified signal RF1 supplied from the second end of the interstage matching circuit 21 to the input terminal 52*a* and outputs the output signal RFout from the output terminal 52*b*.

Particularly, a power source voltage supply terminal 176 (power stage power source voltage supply terminal) supplies the power source voltage VCC1 for causing the amplifying transistor 52*c* in the power stage amplifier 52 and is connected to a node N4 through the inductor 27. The output terminal 52*b* is connected to the output terminal 32 through the node N4.

The capacitor 52*d* in the power stage amplifier 52 has a first end connected to the input terminal 52*a* and a second end. The amplifying transistor 52*c* has a collector connected to the output terminal 52*b*, a base connected to the second end of the capacitor 52*d* through the resistive element 52*f*, and an emitter connected to the ground.

The resistive element 52*e* has a first end connected to an output terminal 161*a* of the power stage bias supply circuit 161 and a second end connected to the second end of the capacitor 52*d*.

The power stage bias supply circuit 161 is controlled by a control current input from a control signal supply terminal 173. The power stage bias supply circuit 161 generates a bias voltage to be supplied to the power stage amplifier 52 and outputs the generated bias voltage from the output terminal 161*a*.

The driver stage bias supply circuit 351 supplies a bias to the base of the amplifying transistor 50*c* through the resistive element 50*e*. Particularly, a collector of the biasing transistor 152 in the driver stage bias supply circuit 351 is connected to a battery voltage supply terminal 172. A base of the biasing transistor 152 is connected to a node N1 and is supplied with a bias control current Ib (bias current). An emitter of the biasing transistor 152 is connected to the base of the amplifying transistor 50*c* through the resistive element 50*e* and supplies the bias to the base.

The resistive element 156 has a first end which is supplied with a current from a control signal supply terminal 171 (current source) and a second end connected to the node N1. The transistor 153 is diode-connected and has the collector (anode) and the base (anode) that are connected to the node N1, and the emitter (cathode). The transistor 154 is diode-connected and has the collector (anode) and the base (anode) that are connected to the emitter of the transistor 153, and the emitter (cathode) connected to the ground.

The current supplied from the control signal supply terminal 171 flows to the diode-connected transistors 153 and 154, thereby generating a reference voltage almost constant with respect to the ground in the node N1. The reference voltage puts the biasing transistor 152 in an on state, and the bias control current Ib flows from the node N1 toward the base of the biasing transistor 152 and the bypass circuit 201.

The bypass circuit 201 is provided between the base of the biasing transistor 152 and the node N3 that is supplied with a signal with experience of being amplified by the driver stage amplifier 50, such as the amplified signal RF1, and the power source voltage VCC1. The bypass circuit 201 feeds a part of the bias control current Ib to the node N3 when a voltage of the node N3 is less than a predetermined threshold. The predetermined threshold here is, for example, a value obtained by subtracting an on voltage of the transistor 251 from a base voltage Vb1 of the transistor 251.

Specifically, the resistive element 253*a* included in the voltage shift circuit 253 has a first end connected to the base of the biasing transistor 152 and a second end. The capacitor 252 has a first end connected to the second end of the resistive element 253*a* and a second end connected to the ground.

The transistor 251 has a collector connected to the emitter of the transistor 153, a base connected to the second end of the resistive element 253*a*, and an emitter connected to the node N3.

Figure 2:
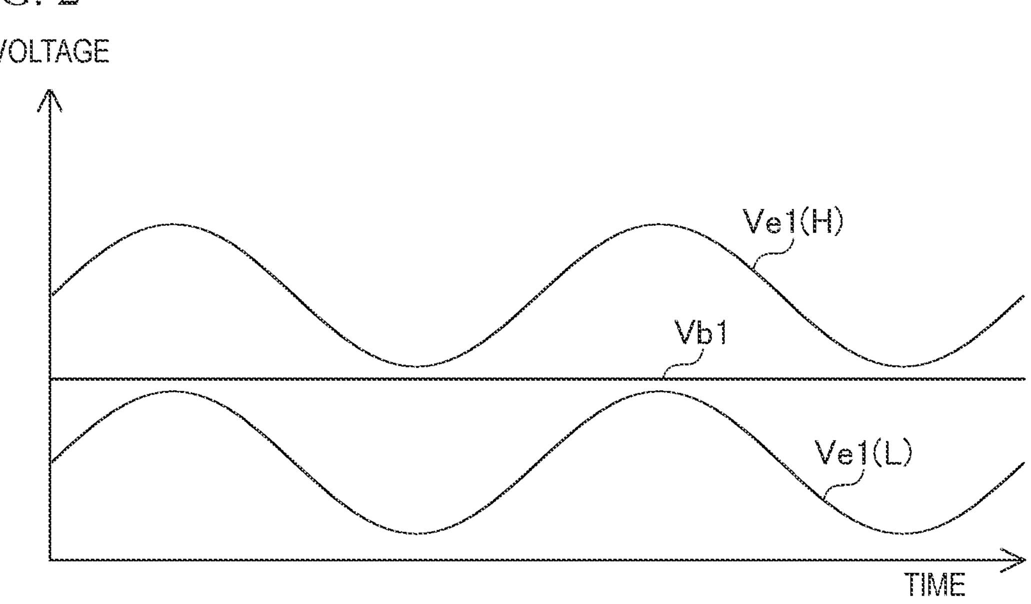
FIG. 2 is a graph showing one example of temporal changes in a base voltage Vb1 and an emitter voltage Ve1 of a transistor 251.
Figure 3:
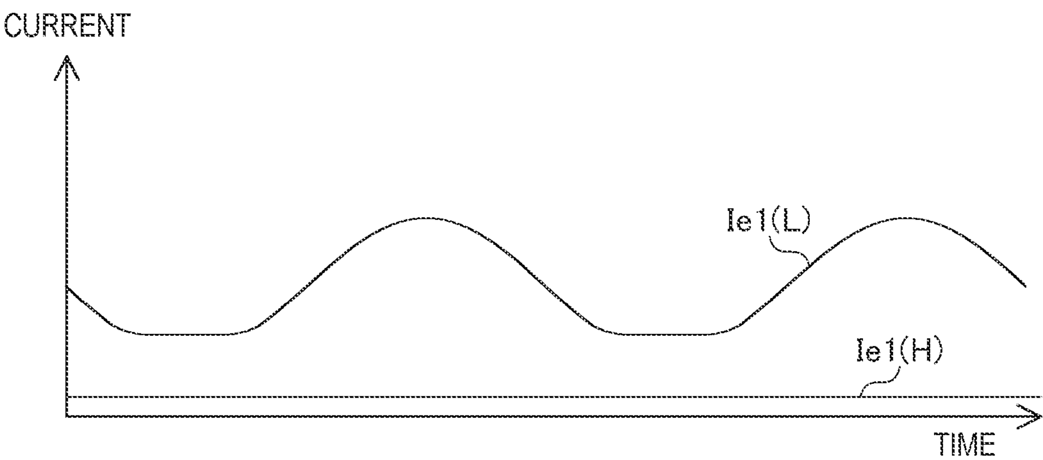
FIG. 3 is a graph showing one example of a temporal change in an emitter current Ie1 of the transistor 251.

Operation of the bypass circuit 201 will be described below. FIG. 2 is a graph showing one example of temporal changes in the base voltage Vb1 and an emitter voltage Ve1 of the transistor 251. FIG. 3 is a graph showing one example of a temporal change in an emitter current Ie1 of the transistor 251.

As shown in FIGS. 1 to 3, since the base of the transistor 251 is connected to the ground through the capacitor 252, the base is short-circuited to the ground at an RF frequency. Thus, the base voltage Vb1 of the transistor 251 is constant without necessarily a temporal change.

The emitter voltage Ve1 of the transistor 251 is a voltage commensurate with the power source voltage VCC1 of the driver stage amplifier 50 and power of the amplified signal RF1. Specifically, if the power source voltage VCC1 is high (for example, 3.4 V), an emitter voltage Ve1(H) of the transistor 251 is higher than the base voltage Vb1 (see FIG. 2). In this case, an emitter current Ie1(H) does not flow in the transistor 251 (see FIG. 3).

On the other hand, if the power source voltage VCC1 is low (for example, 2.0 V), an emitter voltage Ve1(L) of the transistor 251 is lower than the base voltage Vb1 (see FIG. 2). In this case, an emitter current Ie1(L) flows in the transistor 251 at a moment when a difference between the base voltage Vb1 and the emitter voltage Ve1(L) becomes more than the on voltage of the transistor 251 (see FIG. 3). That is, a part of a current which flows from the node N1 to the ground through the transistors 153 and 154 flows as a collector current Ic1 of the transistor 251 to the node N3.

Since the flowing of the collector current Ic1 reduces the bias control current Ib, the bias supplied to the amplifying transistor 50*c* by the biasing transistor 152 decreases, and output power from the driver stage amplifier 50 decreases.

Figure 4:
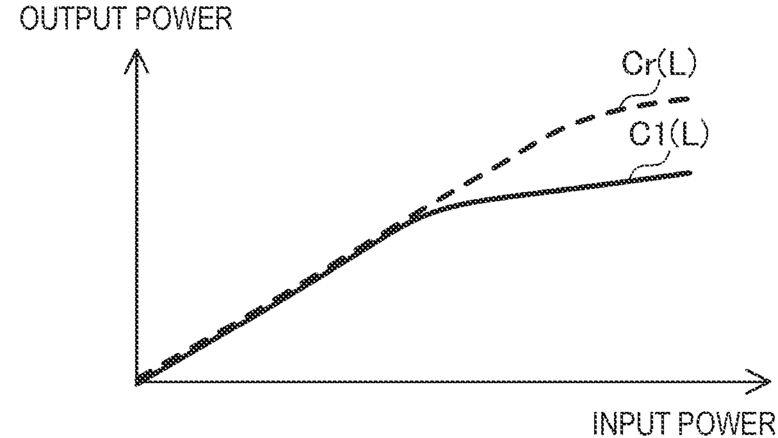
FIG. 4 is a graph showing one example of an amplification characteristic of a driver stage amplifier 50 in a case where a power source voltage VCC1 is low.

FIG. 4 is a graph showing one example of an amplification characteristic of the driver stage amplifier 50 in a case where the power source voltage VCC1 is low. Note that the abscissa indicates power (hereinafter may be referred to as input power) of the input signal RFin while the ordinate indicates the power (hereinafter may be referred to as output power) of the amplified signal RF1 from the driver stage amplifier 50.

As shown in FIG. 4, a curve Cr(L) indicates an amplification characteristic of the driver stage amplifier 50 in a case using a conventional bias supply circuit (hereinafter may be referred to as a conventional circuit) without necessarily the bypass circuit 201. A curve C1(L) indicates an amplification characteristic in a case using the driver stage bias supply circuit 351 shown in FIG. 1.

In the case using the driver stage bias supply circuit 351, the output power starts to be limited from a region with small input power, as compared with the case using the conventional circuit.

Figure 5:
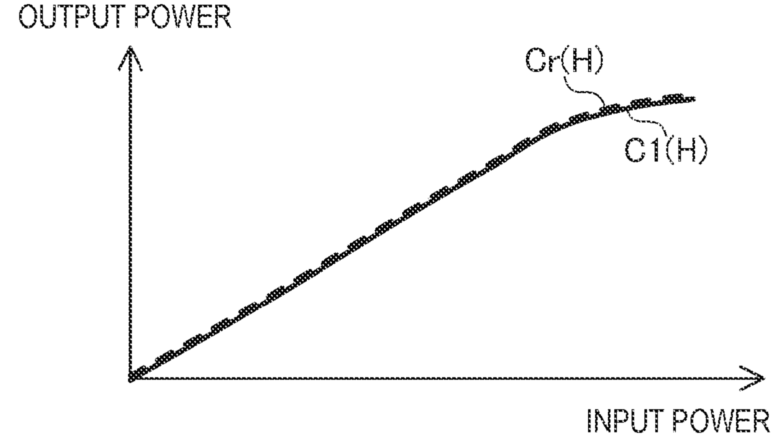
FIG. 5 is a graph showing one example of an amplification characteristic of the driver stage amplifier 50 in a case where the power source voltage VCC1 is high.

FIG. 5 is a graph showing one example of an amplification characteristic of the driver stage amplifier 50 in a case where the power source voltage VCC1 is high. Note that how to read FIG. 5 is the same as how to read FIG. 4.

As shown in FIG. 5, a curve Cr(H) indicates an amplification characteristic in a case using the conventional circuit. A curve C1(H) indicates an amplification characteristic in a case using the driver stage bias supply circuit 351 shown in FIG. 1.

In the case where the power source voltage VCC1 is high, the amplification characteristic of the driver stage amplifier 50 is almost the same in both the case using the driver stage bias supply circuit 351 and the case using the conventional circuit.

Thus, since the output power is limited in the case where the power source voltage VCC1 is low, and input power to the power stage amplifier 52 can be reduced. That is, since an amplitude of the amplified signal RF1 can be reduced, a base potential of the amplifying transistor 52*c* included in the power stage amplifier 52 can be inhibited from becoming instantaneously higher than a collector potential. This makes it possible to inhibit a parasitic diode between a base and a collector of the amplifying transistor 52*c* from being turned on, and by extension to inhibit a signal of a frequency almost half of a frequency of the amplified signal RF1 from being superimposed on the output signal RFout and the superimposition from inducing oscillation.

Note that although, as for the driver stage bias supply circuit 351, a configuration in which the emitter of the transistor 251 is connected to the node N3 has been described, the driver stage bias supply circuit 351 is not limited to this. The emitter of the transistor 251 only needs to be configured to be connected to a node which is supplied with a signal with experience of being amplified by the amplifying transistor 50*c* and the power source voltage VCC1. Specifically, the emitter of the transistor 251 may be configured to be connected to the input terminal 52*a* of the power stage amplifier 52 or the node N4. Especially, if the emitter of the transistor 251 is connected to the node N4, oscillation induced by to the signal described earlier of the frequency almost half of the frequency of the amplified signal RF1 can be effectively inhibited.

Although, as for the driver stage bias supply circuit 351, a configuration in which the voltage shift circuit 253 includes the resistive element 253*a* has been described, the driver stage bias supply circuit 351 is not limited to this. The voltage shift circuit 253 may be configured to include an inductor or a diode (third diode).

Although, as for the driver stage bias supply circuit 351, a configuration in which the collector of the transistor 251 is connected to the emitter of the transistor 153 has been described, the driver stage bias supply circuit 351 is not limited to this. The collector of the transistor 251 may be configured to be directly connected to the base of the biasing transistor 152.

Although a configuration in which the driver stage bias supply circuit 351 includes the voltage shift circuit 253 has been described, the driver stage bias supply circuit 351 is not limited to this. The driver stage bias supply circuit 351 may be configured not to include the voltage shift circuit 253 and may be configured such that the base of the transistor 251 and the first end of the capacitor 252 are directly connected to the base of the biasing transistor 152. In this case, a collector current sometimes does not flow in the transistor 251. However, flowing of a base current from a node N2 to the node N3 through the base and the emitter of the transistor 251 allows suppression of the bias control current Ib supplied to the base of the biasing transistor 152. That is, the transistor 251 functions as a diode. The driver stage bias supply circuit 351 may be configured to include a diode having an anode electrically connected to the base of the biasing transistor 152 and a cathode connected to the node N3 instead of the transistor 251.

Although not shown in FIG. 1, a capacitor may be inserted between the base of the biasing transistor 152 and the ground in the driver stage bias supply circuit 351.

Second Embodiment

A power amplifier circuit 102 according to a second embodiment will be described. In second and subsequent embodiments, a description of matters in common with the first embodiment will be omitted, and only differences will be described. In particular, the same operational effects of the same configurations will not be mentioned one by one in each embodiment.

Figure 6:
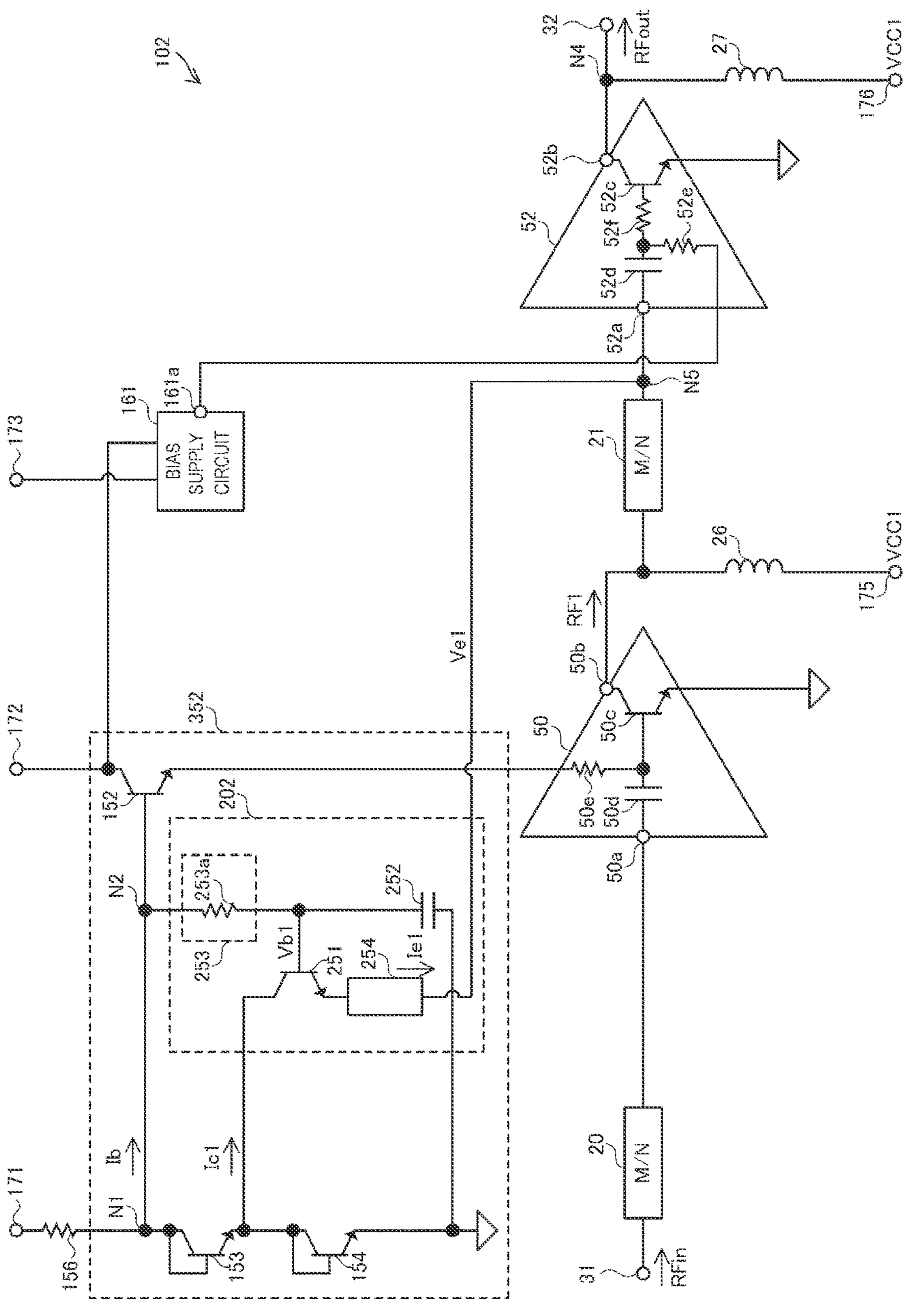
FIG. 6 is a circuit diagram of a power amplifier circuit 102.

FIG. 6 is a circuit diagram of the power amplifier circuit 102. As shown in FIG. 6, the power amplifier circuit 102 according to the second embodiment is different from the power amplifier circuit 101 according to the first embodiment in that a voltage level shift circuit 254 is provided between an emitter of a transistor 251 and an input terminal 52*a* of a power stage amplifier 52.

The power amplifier circuit 102 includes a driver stage bias supply circuit 352 (bias circuit) instead of the driver stage bias supply circuit 351, as compared with the power amplifier circuit 101 shown in FIG. 1. The driver stage bias supply circuit 352 includes a bypass circuit 202 instead of the bypass circuit 201, as compared with the driver stage bias supply circuit 351 shown in FIG. 1. The bypass circuit 202 further includes the voltage level shift circuit 254 (second voltage shift circuit), as compared with the bypass circuit 201 shown in FIG. 1.

The voltage level shift circuit 254 has a first end connected to the emitter of the transistor 251 and a second end connected to a node N5. The node N5 is provided between a second end of an interstage matching circuit 21 and the input terminal 52*a* of the power stage amplifier 52.

The voltage level shift circuit 254 includes, for example, one diode or a plurality of series-connected diodes and is capable of generating a voltage shift amount VA between the first end and the second end.

In the power amplifier circuit 101 shown in FIG. 1, the transistor 251 operates when the power source voltage VCC1 is lower than a base-emitter voltage of the transistor 251. In contrast, in the power amplifier circuit 102 shown in FIG. 6, the transistor 251 operates when a power source voltage VCC1 is less than a value obtained by subtracting VA from a base-emitter voltage of the transistor 251.

Note that although, as for the driver stage bias supply circuit 352, a configuration in which the second end of the voltage level shift circuit 254 is connected to the node N5 has been described, the driver stage bias supply circuit 352 is not limited to this. A configuration in which the second end of the voltage level shift circuit 254 is connected to an output terminal 50*b* of a driver stage amplifier 50 or a node N4 may be adopted.

Third Embodiment

Figure 7:
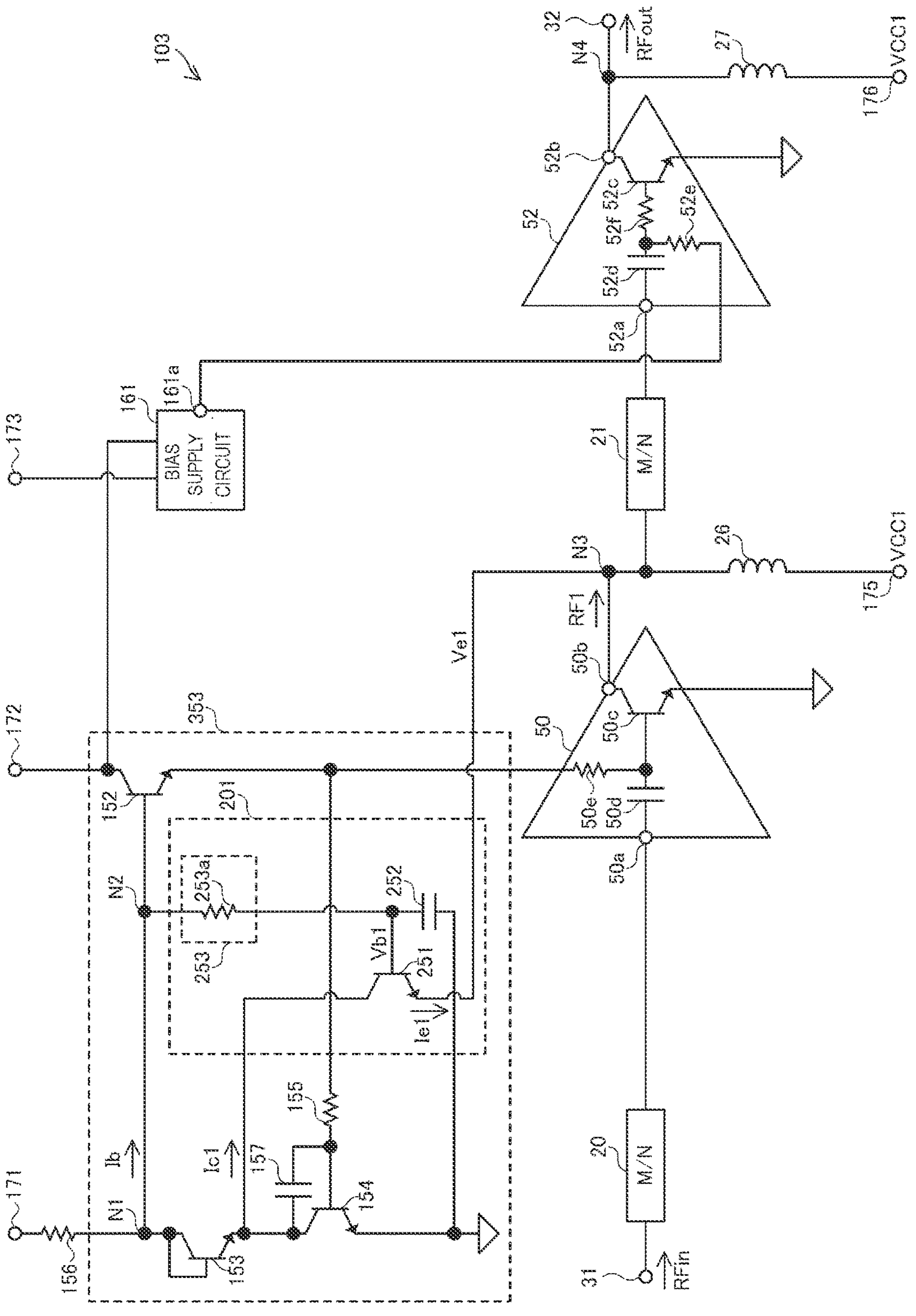
FIG. 7 is a circuit diagram of a power amplifier circuit 103.

A power amplifier circuit 103 according to a third embodiment will be described. FIG. 7 is a circuit diagram of the power amplifier circuit 103. As shown in FIG. 7, the power amplifier circuit 103 according to the third embodiment is different from the power amplifier circuit 101 according to the first embodiment in that a negative feedback circuit is formed between a base and an emitter of a biasing transistor 152.

The power amplifier circuit 103 includes a driver stage bias supply circuit 353 (bias circuit) instead of the driver stage bias supply circuit 351, as compared with the power amplifier circuit 101 shown in FIG. 1. The driver stage bias supply circuit 353 further includes a resistive element 155 (second resistive element) and a capacitor 157 (second capacitor), as compared with the driver stage bias supply circuit 351 shown in FIG. 1.

A transistor 154 (third transistor) in the driver stage bias supply circuit 353 has a collector connected to an emitter of a transistor 153 and a collector of a transistor 251, a base connected to the emitter of the biasing transistor 152 through the resistive element 155, and an emitter connected to the ground.

The capacitor 157 has a first end connected to the collector of the transistor 154 and a second end connected to the base of the transistor 154.

For example, when a potential of the emitter of the biasing transistor 152 becomes high, a base potential of the transistor 154 becomes high, and a collector current of the transistor 154 increases. Since this reduces a bias control current Ib and reduces a base potential of the biasing transistor 152, the emitter potential of the biasing transistor 152 becomes low.

That is, in the driver stage bias supply circuit 353, a negative feedback circuit in which a signal 180 degrees out of phase with a signal in the emitter of the biasing transistor 152 is returned to the base of the biasing transistor 152 is formed.

For the above-described reason, an impedance (hereinafter may be referred to as an output impedance) when the driver stage bias supply circuit 353 is viewed from a base of an amplifying transistor 50*c* can be reduced.

For example, if an input signal RFin has been amplitude-modulated, a component of a carrier wave which vibrates at an RF and a component of a modulated wave which forms an envelope are included in the input signal RFin. Since the output impedance of the driver stage bias supply circuit 353 can be reduced in the power amplifier circuit 103, linearity with respect to a modulated wave can be improved.

Since the configuration, in which the capacitor 157 is provided between the base and the collector of the transistor 154, allows a phase margin for a negative feedback loop of the negative feedback circuit, DC oscillation in the negative feedback loop can be inhibited.

The exemplary embodiments of the present disclosure have been described above. In each of the driver stage bias supply circuits 351 to 353, the biasing transistor 152 has an emitter which supplies a bias to the amplifying transistor 50*c* that operates by the power source voltage VCC1 through the resistive element 50*e*, and a base. The capacitor 252 has a first end electrically connected to the base of the biasing transistor 152 and a second end connected to the ground. The transistor 251 has a collector electrically connected to the base of the biasing transistor 152, a base electrically connected to the base of the biasing transistor 152, and an emitter connected to the node N3, N4, or N5 that is supplied with a signal with experience of being amplified by the driver stage amplifier 50 and the power source voltage VCC1.

With the above-described configuration, if the power source voltage VCC1 is low, and an amplitude of the signal with experience of being amplified by the driver stage amplifier 50 is large, the transistor 251 can be put in an on state at a moment when a difference between a base potential of the transistor 251 and a potential of the node N3, N4, or N5 becomes more than or equal to an on voltage of the transistor 251. The on state of the transistor 251 makes it possible to feed a part of the bias control current Ib to be supplied to the base of the biasing transistor 152 to the node N3, N4, or N5, and the bias to be supplied to the driver stage amplifier 50 by the biasing transistor 152 can be reduced. Since this causes output power from the driver stage amplifier 50 to be limited, input power to the power stage amplifier 52 can be reduced, that is, an amplitude of the amplified signal RF1 can be reduced. A base potential of the amplifying transistor 52*c* included in the power stage amplifier 52 can be inhibited from becoming instantaneously more than a collector potential. Thus, if the power source voltage is low, and power of an RF signal is high, it is possible to inhibit a parasitic diode between a base and a collector of the amplifying transistor 52*c* from being turned on, and by extension to inhibit a signal of a frequency almost half of a frequency of the amplified signal RF1 from being superimposed on the output signal RFout and the superimposition from inducing oscillation.

In the driver stage bias supply circuit 351, the control signal supply terminal 171 is connected to the base of the biasing transistor 152. The transistor 153 is diode-connected and has a collector and a base which are connected to the control signal supply terminal 171, and an emitter. The transistor 154 is diode-connected and has a collector and a base which are connected to the emitter of the transistor 153 and the collector of the transistor 251, and an emitter connected to the ground.

The above-described configuration, in which the transistor 251 feeds a current to the node N3, N4, or N5 allows increase in a current which flows from the transistor 153, and the bias control current Ib to be supplied to the base of the biasing transistor 152 can be suppressed. For this reason, a current to be supplied to the base of the driver stage amplifier 50 can be reduced, and the output power from the driver stage amplifier 50 can be appropriately limited.

In the driver stage bias supply circuit 352, the voltage level shift circuit 254 is connected between the emitter of the transistor 251 and the node N5.

With the above-described configuration, the potential of the node N5 that causes the transistor 251 to transit to the on state can be adjusted using the voltage shift amount VA of the voltage level shift circuit 254.

In the driver stage bias supply circuit 353, the control signal supply terminal 171 is connected to a base of the biasing transistor 152. The transistor 153 is diode-connected and has the collector and the base that are connected to the control signal supply terminal 171, and the emitter. The transistor 154 has the collector connected to the emitter of the transistor 153 and the collector of the transistor 251, the base connected to the emitter of the biasing transistor 152 through the resistive element 155, and the emitter connected to the ground.

With the above-described configuration, a negative feedback circuit which extends from the emitter of the biasing transistor 152 to the base of the biasing transistor 152 through the resistive element 155, the base of the transistor 154, the collector of the transistor 154, and the transistor 153 can be formed. For this reason, even if a potential of the emitter of the biasing transistor 152 changes, the driver stage bias supply circuit 353 can be made to operate in a direction which cancels out the change by the negative feedback circuit. This allows reduction in output impedance when the driver stage bias supply circuit 353 is viewed from a base of the amplifying transistor 50*c*.

In the driver stage bias supply circuit 353, the capacitor 157 has a first end connected to the collector of the transistor 154 and a second end connected to the base of the transistor 154.

Since the configuration, in which the capacitor 157 is provided between the base and the collector of the transistor 154, allows a phase margin for a negative feedback loop of the negative feedback circuit, DC oscillation in the negative feedback loop can be inhibited.

In each of the driver stage bias supply circuits 351 to 353, the voltage shift circuit 253 has a first end connected to the base of the biasing transistor 152 and a second end connected to the base of the transistor 251.

Since the above-described configuration allows inhibition of an excessive flow of a base current of the transistor 251, the bias control current Ib to be supplied to the base of the biasing transistor 152 can be appropriately suppressed. Also, since the base potential of the transistor 251 can be appropriately reduced, it is possible to cause a collector current to flow appropriately in the transistor 251.

In each of the driver stage bias supply circuits 351 to 353, the voltage shift circuit 253 includes the resistive element 253*a*.

With the above-described configuration, an amount by which the base potential of the transistor 251 is lower than a base potential of the biasing transistor 152 can be adjusted by a simple element, such as the resistive element 253*a*.

In each of the driver stage bias supply circuits 351 to 353, the voltage shift circuit 253 includes a third diode.

With the above-described configuration, the amount, by which the base potential of the transistor 251 is lower than the base potential of the biasing transistor 152, can be adjusted by a simple element, such as the third diode.

In each of the driver stage bias supply circuits 351 to 353, the voltage shift circuit 253 includes an inductor.

With the above-described configuration, the amount, by which the base potential of the transistor 251 is lower than the base potential of the biasing transistor 152, can be adjusted by a simple element, such as the inductor.

In each of the driver stage bias supply circuits 351 to 353, the biasing transistor 152 has the emitter that supplies the bias to the amplifying transistor 50*c* operating by the power source voltage VCC1 through the resistive element 50*e* and the base that is supplied with the bias control current Ib. The bypass circuit 201 or 202 is provided between the base of the biasing transistor 152 and the node N3, N4, or N5 that is supplied with the signal with experience of being amplified by the driver stage amplifier 50 and the power source voltage VCC1, and feeds the part of the bias control current Ib to the node N3, N4, or N5 when a voltage of the node N3, N4, or N5 is less than a predetermined threshold.

The above-described configuration that feeds the part of the bias control current Ib to the node N3, N4, or N5 at a moment when the potential of the node N3, N4, or N5 becomes less than the predetermined threshold makes it possible to reduce the bias to be supplied to the driver stage amplifier 50 by the biasing transistor 152 in a case where the power source voltage VCC1 is low and the amplitude of the signal with experience of being amplified by the driver stage amplifier 50 is large. Since this causes the output power from the driver stage amplifier 50 to be limited, the input power to the power stage amplifier 52 can be reduced, that is, the amplitude of the amplified signal RF1 can be reduced. The base potential of the amplifying transistor 52*c* included in the power stage amplifier 52 can be inhibited from becoming instantaneously more than the collector potential. Thus, if the power source voltage is low, and the power of the RF signal is high, it is possible to inhibit the parasitic diode between the base and the collector of the amplifying transistor 52*c* from being turned on, and by extension to inhibit the signal of the frequency almost half of the frequency of the amplified signal RF1 from being superimposed on the output signal RFout and the superimposition from inducing oscillation.

Note that the embodiments described above are intended to facilitate understanding of the present disclosure and are not intended to limitedly interpret the present disclosure. The present disclosure can be changed/improved without necessarily departing from the spirit thereof, and equivalents thereof are also included in the present disclosure. That is, ones obtained by appropriately making a design change to the embodiments by those skilled in the art are also included in the scope of the present disclosure as long as the ones include features of the present disclosure. For example, elements included in the embodiments and arrangement, materials, conditions, shapes, sizes, and the like thereof are not limited to the illustrated ones and can be appropriately changed. It is obvious that the embodiments are illustrative and partial replacement or combination of components illustrated in different embodiments can be made. Such partial replacement or combination is included in the scope of the present disclosure as long as the partial replacement or combination includes features of the present disclosure.

<1>

A bias circuit including:

a first transistor having an emitter or a source which supplies a bias to an amplifier operating by a power source voltage through a first resistive element and a base or a gate;

a first capacitor having a first end electrically connected to the base or the gate of the first transistor and a second end connected to a ground; and a second transistor having a collector or a drain electrically connected to the base or the gate of the first transistor, a base or a gate electrically connected to the base or the gate of the first transistor, and an emitter or a source connected to a node which is supplied with a signal with experience of being amplified by the amplifier and the power source voltage.

<2>

The bias circuit according to <1>, further including:

a current source connected to the base or the gate of the first transistor;

a first diode having an anode connected to the current source and a cathode; and a second diode having an anode connected to the cathode of the first diode and the collector or the drain of the second transistor and a cathode connected to the ground.

<3>

The bias circuit according to <1> or <2>, further including:

a second voltage shift circuit connected between the emitter or the source of the second transistor and the node.

<4>

The bias circuit according to <1>, further including:

a current source connected to the base or the gate of the first transistor;

a first diode having an anode connected to the current source and a cathode; and a third transistor having a collector or a drain connected to the cathode of the first diode and the collector or the drain of the second transistor, a base or a gate connected to the emitter or the source of the first transistor through a second resistive element, and an emitter or a source connected to the ground.

<5>

The bias circuit according to <4>, further including:

a second capacitor having a first end connected to the collector or the drain of the third transistor and a second end connected to the base or the gate of the third transistor.

<6>

The bias circuit according to any one of <1> to <5>, further including:

a first voltage shift circuit having a first end connected to the base or the gate of the first transistor and a second end connected to the base or the gate of the second transistor.

<7>

The bias circuit according to <6>, in which the first voltage shift circuit includes a third resistive element.

<8>

The bias circuit according to <6>, in which the first voltage shift circuit includes a third diode.

<9>

The bias circuit according to <6>, in which the first voltage shift circuit includes an inductor.

<10>

A bias circuit including:

a first transistor having an emitter or a source which supplies a bias to an amplifier operating by a power source voltage through a first resistive element and a base or a gate which is supplied with a bias current; and a bypass circuit which is provided between the base or the gate of the first transistor and a node supplied with a signal with experience of being amplified by the amplifier and the power source voltage and feeds a part of the bias current to the node when a voltage of the node is less than a predetermined threshold.

<11>

A power amplifier circuit including:

the bias circuit according to any one of <1> to <10>; and the amplifier.

<12>

The power amplifier circuit according to <11>, in which the amplifier is a driver stage amplifier, and the power amplifier circuit further includes a power stage amplifier which amplifies the signal amplified by the driver stage amplifier and outputs an output signal.

<13>

The power amplifier circuit according to <12>, in which the node is connected to a driver stage output terminal from which the signal amplified by the driver stage amplifier is output and a driver stage power source voltage supply terminal which supplies the power source voltage to the driver stage amplifier.

<14>

The power amplifier circuit according to <12>, further including:

an interstage matching circuit provided between the driver stage amplifier and the power stage amplifier, in which the node is a node between the interstage matching circuit and the power stage amplifier.

<15>

The power amplifier circuit according to <12>, in which the node is connected to a power stage output terminal from which the signal amplified by the power stage amplifier is output and a power stage power source voltage supply terminal which supplies the power source voltage to the power stage amplifier.

What is claimed is:

1. A bias circuit comprising:

a first transistor having an emitter or a source and a base or a gate, the first transistor being configured to supply a bias from the emitter or the source to an amplifier through a first resistive element;

a first capacitor having a first end electrically connected to the base or the gate of the first transistor, and a second end connected to ground; and a second transistor having a collector or a drain electrically connected to the base or the gate of the first transistor, a base or a gate electrically connected to the base or the gate of the first transistor, and an emitter or a source connected to a node, the node being supplied with a signal having been amplified by the amplifier, and the node being electrically connected to a power source voltage of the amplifier.

2. The bias circuit according to claim 1, further comprising:

a current source connected to the base or the gate of the first transistor;

a first diode having an anode connected to the current source; and a second diode having an anode connected to a cathode of the first diode and to the collector or the drain of the second transistor, and a cathode connected to ground.

3. The bias circuit according to claim 1, further comprising:

a second voltage shift circuit connected between the emitter or the source of the second transistor and the node.

4. The bias circuit according to claim 1, further comprising:

a current source connected to the base or the gate of the first transistor;

a first diode having an anode connected to the current source; and a third transistor having a collector or a drain connected to a cathode of the first diode and to the collector or the drain of the second transistor, a base or a gate connected to the emitter or the source of the first transistor through a second resistive element, and an emitter or a source connected to ground.

5. The bias circuit according to claim 4, further comprising:

a second capacitor having a first end connected to the collector or the drain of the third transistor, and a second end connected to the base or the gate of the third transistor.

6. The bias circuit according to claim 1, further comprising:

a first voltage shift circuit having a first end connected to the base or the gate of the first transistor and a second end connected to the base or the gate of the second transistor.

7. The bias circuit according to claim 6, wherein the first voltage shift circuit comprises a third resistive element.

8. The bias circuit according to claim 6, wherein the first voltage shift circuit comprises a third diode.

9. The bias circuit according to claim 6, wherein the first voltage shift circuit comprises an inductor.

10. A bias circuit comprising:

a first transistor having an emitter or a source and a base or a gate, the first transistor configured to supply a bias current from the emitter or the source of the first transistor to an amplifier through a first resistive element; and a bypass circuit between the base or the gate of the first transistor and a node, and that is configured to feed a part of the bias current to the node when a voltage of the node is less than a predetermined threshold, wherein the node is supplied with a signal having been amplified by the amplifier, and wherein the node is electrically connected to a power source voltage of the amplifier.

11. A power amplifier circuit comprising:

the bias circuit according to claim 1; and the amplifier.

12. The power amplifier circuit according to claim 11, wherein the amplifier is a driver stage amplifier, and wherein the power amplifier circuit further comprises:

a power stage amplifier configured to amplify a signal amplified by the driver stage amplifier, and to output an output signal.

13. The power amplifier circuit according to claim 12, wherein the node is connected to a driver stage output terminal from which the signal amplified by the driver stage amplifier is output, and to a driver stage power source voltage supply terminal which is configured to supply the power source voltage to the driver stage amplifier.

14. The power amplifier circuit according to claim 12, further comprising:

an interstage matching circuit between the driver stage amplifier and the power stage amplifier, wherein the node is between the interstage matching circuit and the power stage amplifier.

15. The power amplifier circuit according to claim 12, wherein the node is connected to a power stage output terminal from which the signal amplified by the power stage amplifier is output, and to a power stage power source voltage supply terminal configured to supply the power source voltage to the power stage amplifier.

* * * * *